(12) United States Patent
Doya et al.

(10) Patent No.: US 10,895,329 B2
(45) Date of Patent: Jan. 19, 2021

(54) FLUID CONTROL SYSTEM, BASE BLOCK USED FOR SAME, AND METHOD FOR MANUFACTURING FLUID CONTROL SYSTEM

(71) Applicant: FUJIKIN INCORPORATED, Osaka (JP)

(72) Inventors: Hidehiro Doya, Osaka (JP); Masaru Sato, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 16/332,233

(22) PCT Filed: Sep. 7, 2017

(86) PCT No.: PCT/JP2017/032277
§ 371 (c)(1),
(2) Date: Mar. 11, 2019

(87) PCT Pub. No.: WO2018/047907
PCT Pub. Date: Mar. 15, 2018

(65) Prior Publication Data
US 2019/0271402 A1 Sep. 5, 2019

(30) Foreign Application Priority Data

Sep. 12, 2016 (JP) ................. 2016-177358

(51) Int. Cl.
*F16K 27/00* (2006.01)
*H01L 21/02* (2006.01)

(52) U.S. Cl.
CPC ............ *F16K 27/003* (2013.01); *F16K 27/00* (2013.01); *H01L 21/02* (2013.01)

(58) Field of Classification Search
CPC ......... F16K 27/003; F16K 27/00; H01L 21/02
See application file for complete search history.

(56) References Cited

U.S. PATENT DOCUMENTS 4,415,004 A * 11/1983 Bouteille ............ F15B 13/0807
137/624.14
5,699,834 A * 12/1997 Hayashi .............. F15B 13/0817
137/884

(Continued)

FOREIGN PATENT DOCUMENTS

| CN | 101147018 A | 3/2008 |
| CN | 104696569 A * | 6/2015 |

(Continued)

OTHER PUBLICATIONS

Office Action issued in Chinese family member Patent Appl. No. 201780056111.6, dated Oct. 11, 2019.

(Continued)

*Primary Examiner* — Angelisa L. Hicks
(74) *Attorney, Agent, or Firm* — Greenblum & Bernstein P.L.C.

(57) ABSTRACT

Provided is a fluid control system including upstream-side and downstream-side base blocks, each defining a flow path provided with flow path ports, including a screw hole and a screw hole formed between the two flow path ports in longitudinal directions, and coupling to the upstream-side and downstream-side base blocks and a body of a fluid device by tightening bolts. End portions of the upstream-side and downstream-side base blocks are coupled to each other by the tightening bolts.

13 Claims, 18 Drawing Sheets

(56) References Cited

U.S. PATENT DOCUMENTS

| | | |
|---|---|---|
| 2009/0212039 A1 | 8/2009 | Shikata |
| 2010/0096031 A1 | 4/2010 | Okase et al. |
| 2019/0162323 A1 | 5/2019 | Aikawa et al. |

FOREIGN PATENT DOCUMENTS

| | | |
|---|---|---|
| CN | 104696569 A | 6/2015 |
| JP | 2008-298177 A | 12/2008 |
| JP | 2016-050635 A | 4/2016 |
| WO | 2008/149702 A1 | 8/2010 |

OTHER PUBLICATIONS

U.S. Appl. No. 16/312,015 to Kenji Aikawa et al., filed Dec. 20, 2018.
U.S. Appl. No. 16/344,235 to Hidehiro Doya, filed Apr. 23, 2019.
International Search Report issued in WIPO Patent Application No. PCT/JP2017/032277, dated Oct. 24, 2017.

\* cited by examiner

FLUID CONTROL SYSTEM, BASE BLOCK USED FOR SAME, AND METHOD FOR MANUFACTURING FLUID CONTROL SYSTEM

FIELD OF THE INVENTION

The present invention relates to a fluid control system with fluid devices, including a fluid control device, integrated therein, a base block used therefor, and a method for manufacturing the fluid control system that uses the base block.

DESCRIPTION OF THE BACKGROUND ART

In various manufacturing processes such as a semiconductor manufacturing process, a fluid control system called an integrated gas system (IGS; registered trademark), in which various fluid control devices, such as a switch valve, a regulator, and a mass flow controller, are integrated and housed in a box, is used to supply an accurately measured process gas to a process chamber (refer to Patent Documents 1 to 3, for example). This box with the IGS (registered trademark) housed therein is called a gas box.

In such an IGS (registered trademark), integration is achieved by arranging, in place of a pipe joint, an installation block (hereinafter referred to as "base block") that forms a flow path in a longitudinal direction of a base plate, and installing various fluid devices, such as a plurality of fluid control devices and joint blocks to which pipe joints are connected, on this base block.

PATENT DOCUMENTS

Patent Document 1: Japanese Laid-Open Patent Application No. 2008-298177
Patent Document 2: Japanese Laid-Open Patent Application No. 2016-050635
Patent Document 3: WO2008/149702

SUMMARY OF THE INVENTION

Problems to be Solved by the Invention

To control the supply of a process gas of various manufacturing processes, higher responsiveness is required. To this end, the fluid control system needs to be made more compact and integrated to the extent possible to install the system closer to the process chamber that is the supply destination of the fluid.

Along with increase in the size of the objects to be processed, such as the increase in size of the diameter of the semiconductor wafer, it becomes necessary to also increase a supply flow rate of the fluid supplied from the fluid control system into the process chamber.

As the fluid control system is made more compact and integrated, the assembly work becomes difficult and the assembly man-hours increase. Further, the maintainability of the system also deteriorates. In particular, when the block on which the fluid devices are installed is made more compact, various problems arise such as a decrease in a support rigidity of the block, difficulty in processing the flow path, and difficulty in securing a forming region of through holes for fixing the block to the base plate with bolts.

An object of the present invention is to provide a fluid control system which, without reducing the supply flow rate of a fluid, is considerably more compact and integrated.

Another object of the present invention is to provide a fluid control system that achieves greatly reduced assembly man-hours, and has improved maintenance performance as well.

A yet further object of the present invention is to increase a support rigidity of the base block for supporting fluid devices, including various fluid control devices, while narrowing a dimension, in particular a width dimension, of the base block.

Means for Solving the Problems

A fluid control system according to a first aspect of the present invention comprises a fluid device provided with a body defining a fluid flow path, the fluid flow path comprising two flow path ports that open at a bottom surface of the body; and
an upstream-side base block and a downstream-side base block disposed in a predetermined direction, wherein:
the upstream-side and downstream-side base blocks each define an upper surface on which a portion of the body of the fluid device is installed, a bottom surface opposite to the upper surface, and side surfaces extending from the upper surface toward the bottom surface side, define a fluid flow path comprising two flow path ports that open on an upstream side and a downstream side of the upper surface, and comprise a screw hole that is formed between the two flow path ports in the predetermined direction, opens at the upper surface, and extends toward the bottom surface side;
the body of the fluid device is fixed to the upper surfaces of the upstream-side and downstream-side base blocks by tightening forces of tightening bolts passed through the body of the fluid device and screwed into the screw holes of the upstream-side and downstream-side base blocks, and a seal member disposed around each of two flow path ports of the fluid device respectively abutted against the flow path port on the downstream side of the upstream-side base block and the flow path port on the upstream side of the downstream-side base block is pressed between the upstream-side and downstream-side base blocks and the body of the fluid device; and
a downstream-side end portion of the upstream-side base block and an upstream-side end portion of the downstream-side base block are coupled by a tightening bolt.

Note that, while in this specification the surfaces of each member are specified using terms such as "upper surface," "lower surface," "bottom surface," and "side surface," these terms are used to specify the relative positions of the surfaces and not necessarily used to specify the absolute positions. For example, when the term "upper surface" is used to define a specific surface and not a vertical relationship, other terms such as "bottom surface," "lower surface," and "side surface" can be relatively defined and are thus used. Similarly, terms such as "upward direction" and "downward direction" are used to define relative directions, and not necessary used to define absolute directions such as the "vertically upward direction."

A fluid control system according to a second aspect of the present invention comprises a fluid device provided with a body defining a fluid flow path, the fluid flow path comprising two flow path ports that open at a bottom surface of the body;
an upstream-side base block and a downstream-side base block disposed in a predetermined direction; and
a coupling base block, wherein:
the upstream-side and downstream-side base blocks each define an upper surface on which a portion of the body of the fluid device is installed, a bottom surface opposite to the upper surface, and side surfaces extending from the upper surface toward the bottom surface side, define a fluid flow path comprising two flow path ports that open on an upstream side and a downstream side of the upper surface, and comprise a screw hole that is formed between the two flow path ports in the predetermined direction, opens at the upper surface, and extends toward the bottom surface side;

the body of the fluid device is fixed to the upper surfaces of the upstream-side and downstream-side base blocks by tightening forces of tightening bolts passed through the body of the fluid device and screwed into the screw holes of the upstream-side and downstream-side base blocks, and a seal member disposed around each of two flow path ports of the fluid device respectively abutted against the flow path port on the downstream side of the upstream-side base block and the flow path port on the upstream side of the downstream-side base block is pressed between the upstream-side and downstream-side base blocks and the body of the fluid device;

the upstream-side base block and the downstream-side base block are disposed apart from each other in the predetermined direction; and the coupling base block is coupled to a downstream-side end portion of the upstream-side base block and an upstream-side end portion of the downstream-side base block by tightening bolts, thus coupling the upstream-side base block to the downstream-side base block.

Preferably, the flow path defined by each of the upstream-side and downstream-side base blocks is configured to include two first flow paths respectively extending from the two flow path ports toward the bottom surface side, and a second flow path extending through interior of each of the upstream-side and downstream-side base blocks in a longitudinal direction and connected to each of the two first flow paths.

Furthermore, preferably the position of the second flow path is biased to the bottom surface side between the upper surface and the bottom surface of each of the upstream-side and downstream-side base blocks.

In the configuration described above, the fluid control system can further comprise a fixing block coupled by a tightening bolt to one end portion of a base block assembly formed by a plurality of base blocks including the upstream-side and downstream-side base blocks, the fixing block being fixable by a tightening bolt to a base plate on which the base block assembly is installed.

A base block for a fluid control system of the present invention is for forming a base block assembly of a plurality of base blocks coupled to each other in order to install a plurality of fluid devices disposed in a predetermined direction, the base block for a fluid control system defining an upper surface, a bottom surface opposite to the upper surface, and side surfaces extending from the upper surface toward the bottom surface side, defining a fluid flow path comprising two flow path ports that open at positions separated from each other in a direction from one end portion toward the other end portion of the upper surface, the bottom surface, and the side surfaces, and comprising:

a screw hole that is formed between the two flow path ports in a direction from one end portion toward the other end portion of the upper surface, the bottom surface, and the side surfaces, opens at the upper surface, and extends toward the bottom surface side; and a coupling part formed in at least one of one end portion and the other end portion of the upper surface, the bottom surface, and the side surfaces, and connectable to another base block or member using a tightening bolt.

A method for manufacturing a fluid control system of the present invention comprises the steps of:

forming a base block assembly by coupling end portions of a plurality of base blocks including at least the upstream-side and downstream-side base blocks described above;

forming one or a plurality of fluid control assemblies by arranging the one or plurality of fluid devices in predetermined positions on an upper surface of the base block assembly and fixing a body of the one or plurality of fluid devices to the upper surface using tightening bolts, and:

fixing the one or plurality of fluid control assemblies on a base plate using the fixing block described above.

A product manufacturing method of the present invention comprises a step of using the fluid control system described above for controlling the process gas in a manufacturing process of a product such as a semiconductor device, a flat panel display, or a solar panel that requires a treatment process by a process gas in a sealed chamber.

Effect of the Invention

According to the present invention, the base block and the base block assembly having the configurations described above are used, making it possible to narrow the width of the base block and, without the need to fix the base block to the base plate, greatly reduce assembly man-hours.

According to the present invention, the base block assembly is obtained by coupling the base blocks using tightening bolts, making it possible to increase a support rigidity required for supporting the fluid devices, including a fluid control device such as a control valve.

According to the present invention, the base block is configured as described above, making it possible to secure a flow path cross-sectional area while narrowing the base block, and thus obtain a fluid control system which, without reducing the supply flow rate of a fluid, is considerably more compact and integrated.

According to the present invention, the base blocks as well as the body of each fluid device and the base blocks are all coupled using tightening bolts, the tightening and release of the tightening bolts are possible from the upward direction, maintainability is improved, and access directions of the tightening bolts are uniformly limited, making automation of the assembly work easy as well.

According to the present invention, the fluid control system can be made greatly more compact and integrated, making it possible to bring the fluid control system as close as possible to the vicinity of the processing chamber, increasing the responsiveness of fluid control and improving the quality of products in various manufacturing processes.

DESCRIPTION OF THE PREFERRED EMBODIMENTS

Figure 1A:
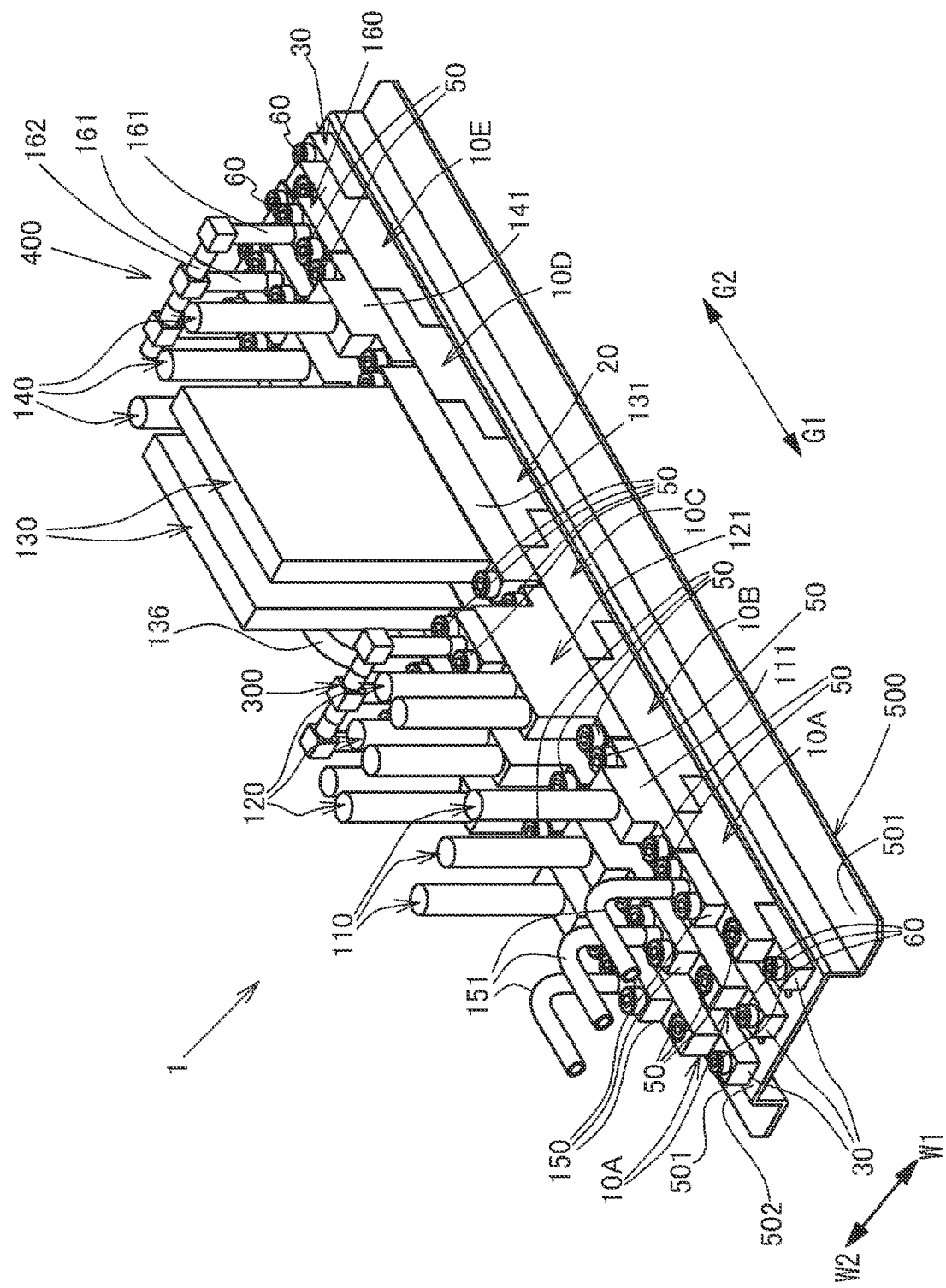
FIG. 1A is an external perspective view from a front side of a fluid control system according to a first embodiment of the present invention.

Embodiments of the present invention are described below with reference to the drawings. Note that, in this specification and the drawings, components having substantially the same function are denoted using the same reference numeral, and duplicate descriptions thereof are omitted.

Figure 1B:
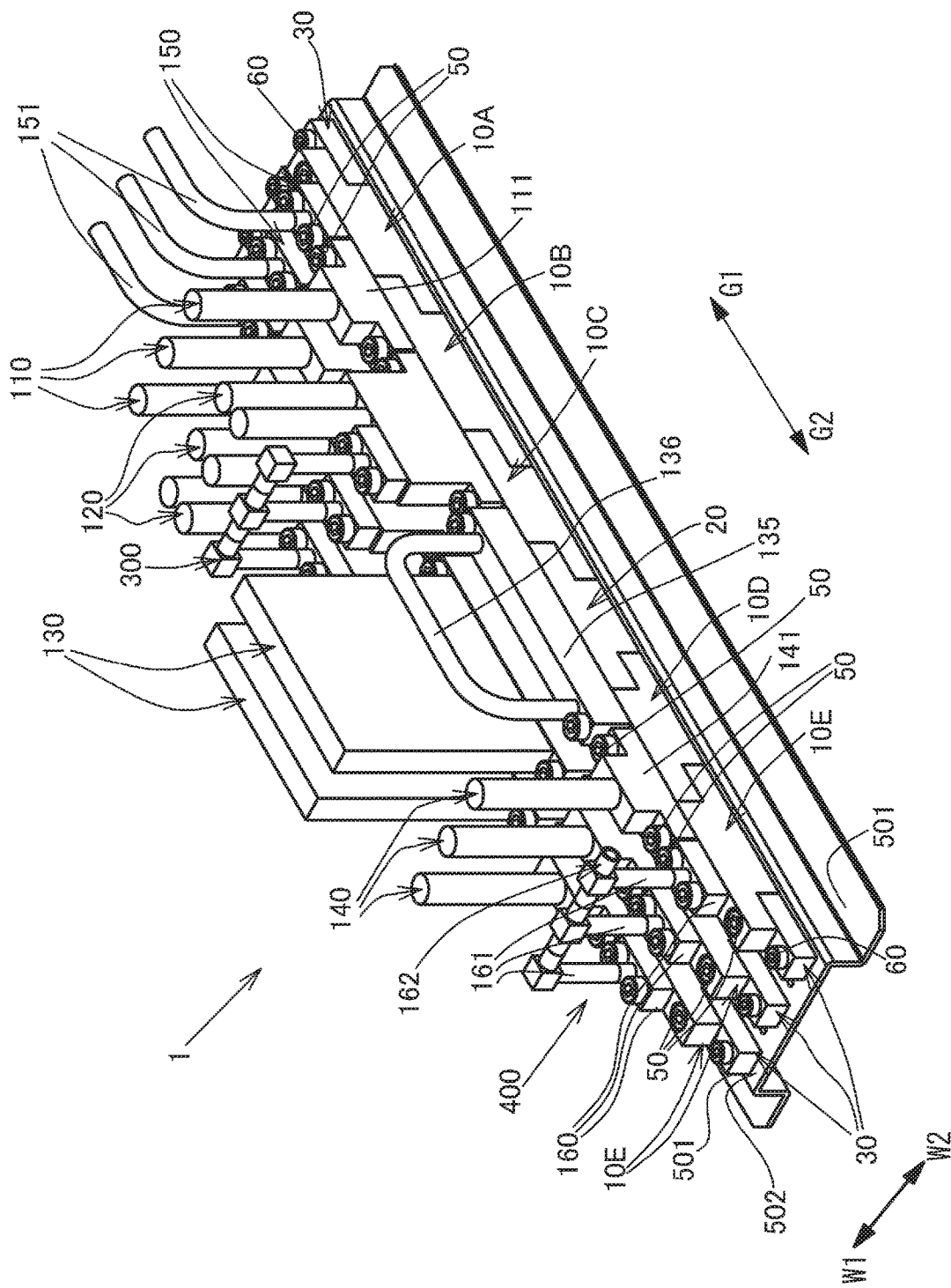
FIG. 1B is an external perspective view from a rear side of the fluid control system in FIG. 1A.
Figure 1C:
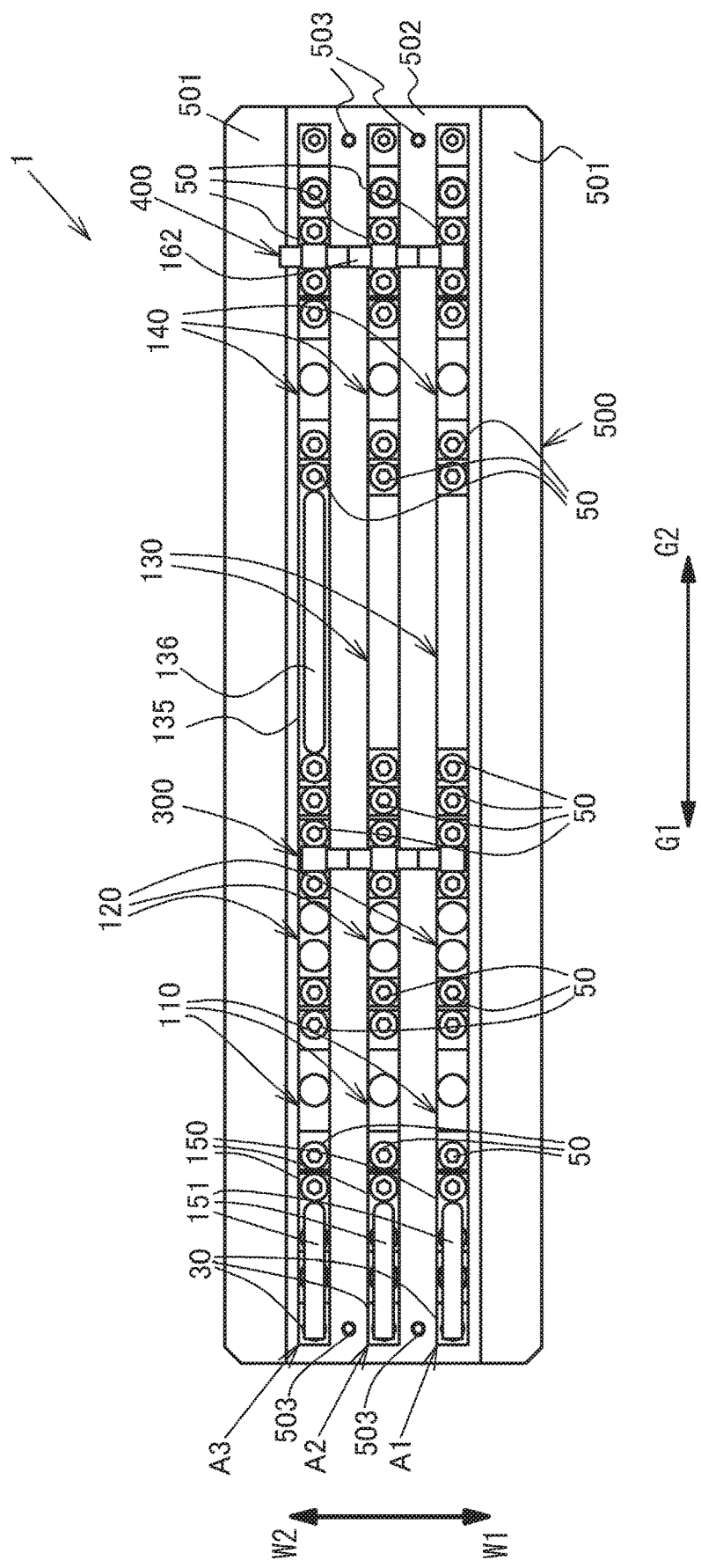
FIG. 1C is a top view of the fluid control system in FIG. 1A.
Figure 1D:
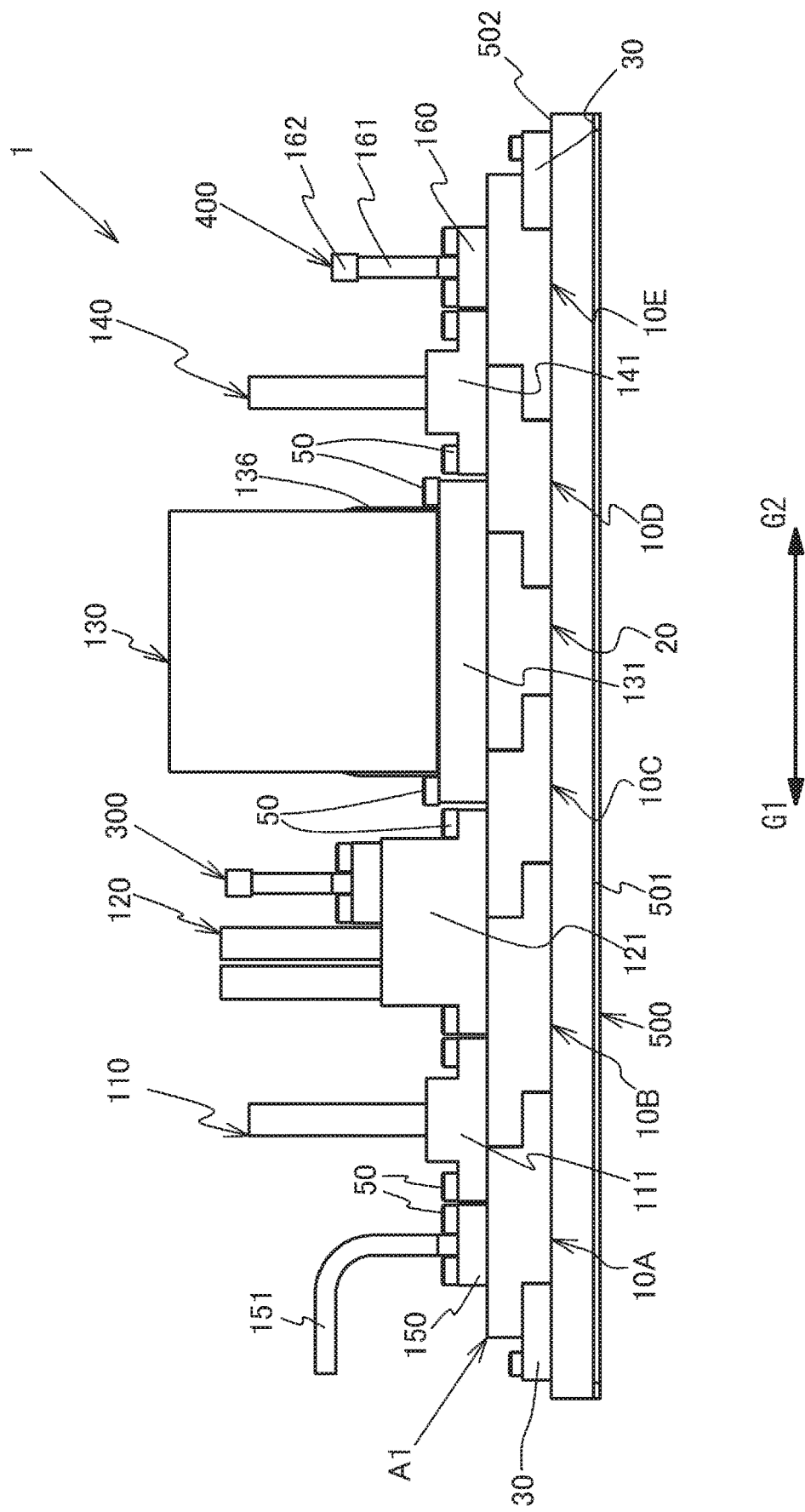
FIG. 1D is a front view of the fluid control system in FIG. 1A.
Figure 1E:
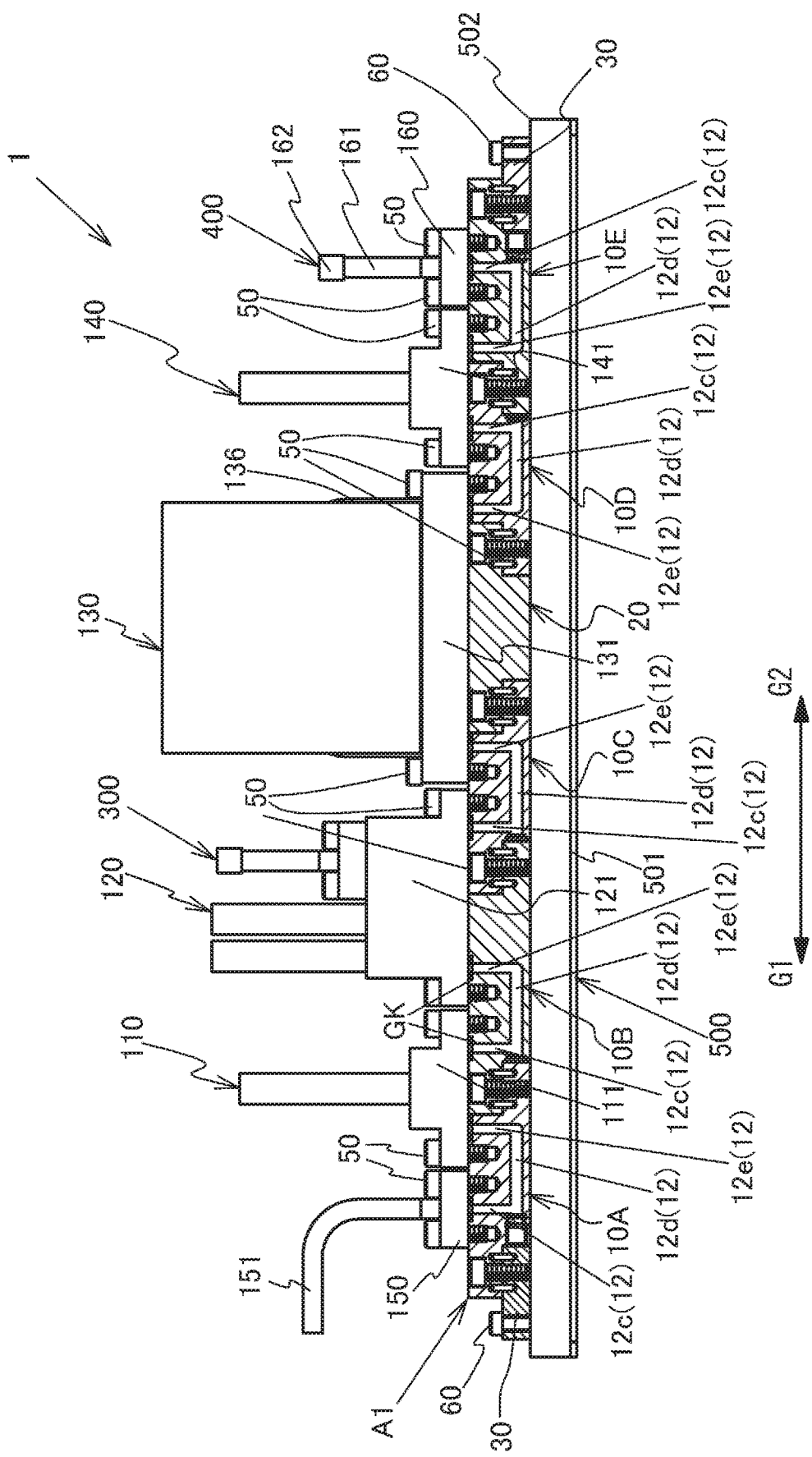
FIG. 1E is a front view including a partial cross section of only a base block in FIG. 1D.
Figure 2A:
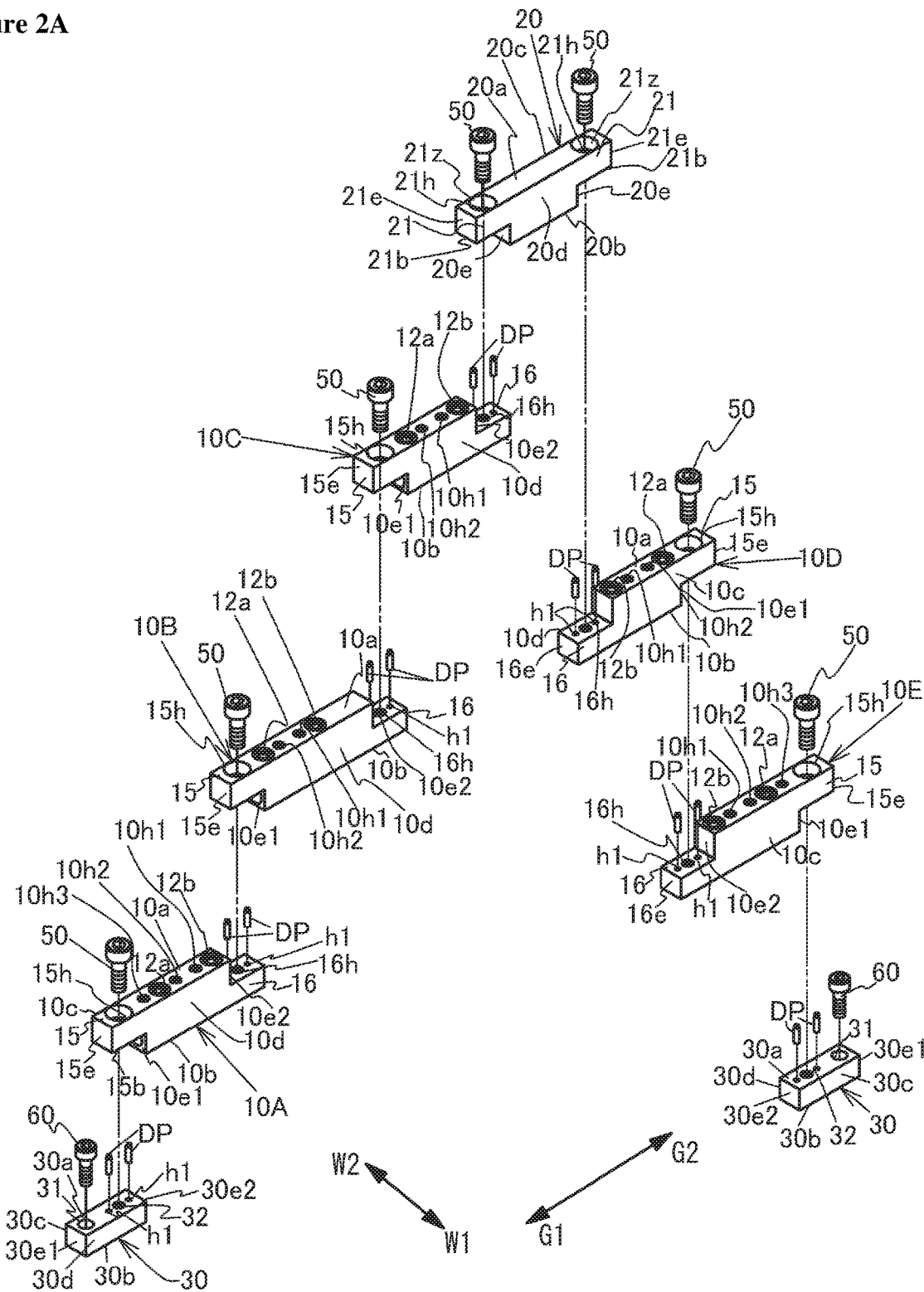
FIG. 2A is an exploded perspective view of a base block assembly.
Figure 2B:
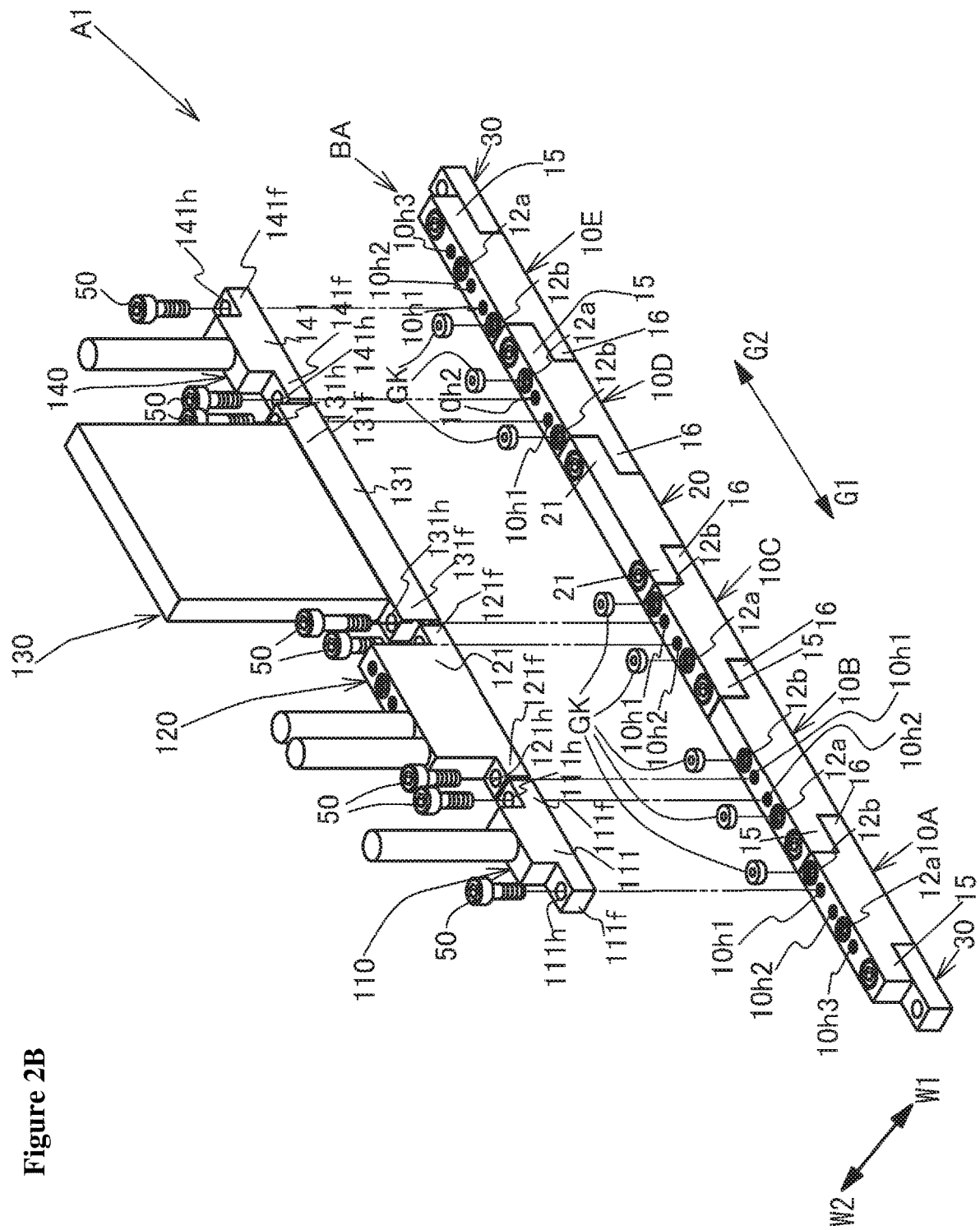
FIG. 2B is an exploded perspective view of a fluid control assembly disassembled into the base block assembly and various fluid devices.

In the following, a fluid control system according to an embodiment of the present invention is described in detail with reference to FIG. 1A to FIG. 5B. FIG. 1A and FIG. 1B are perspective views illustrating the external appearance of the fluid control system according to a first embodiment of the present invention, FIG. 1C is a top view of the fluid control system in FIG. 1A, FIG. 1D is a front view of the fluid control system in FIG. 1A, and FIG. 1E is a front view including a partial cross section of only a base block in FIG. 1D. FIG. 2A is an exploded perspective view of a base block assembly BA, and FIG. 2B is an exploded perspective view of a fluid control assembly A1 disassembled into the base block assembly BA and various fluid devices. It should be noted that W1 and W2 of width directions W1, W2 indicate a front side and a rear side, respectively, and G1 and G2 of longitudinal directions G1, G2 serving as predetermined directions of the present invention indicate an upstream side and a downstream side, respectively.

As illustrated in FIG. 1A to FIG. 1D, a fluid control system 1 includes a base plate 500 and three fluid control assemblies A1, A2, A3 installed on the base plate 500. The base plate 500 comprises support parts 501 formed in both side portions in the width directions W1, W2 by bending a sheet metal plate, and an installation surface 502 disposed at a fixed height from the support parts 501. The fluid control assemblies A1, A2, A3 are fixed on the installation surface 502. The method for fixing the fluid control assemblies A1, A2, A3 to the installation surface 502 is described later.

The fluid control assembly A1 comprises the base block assembly BA described later extending in the longitudinal directions G1, G2, and a switch valve (two-way valve) 110, a switch valve (three-way valve) 120, a mass flow controller 130, and a switch valve (two-way valve) 140 provided in that order from an upstream side toward a downstream side on this base block assembly BA. Then, a joint block 150 to which an introducing pipe 151 is connected is provided on the upstream side of the switch valve (two-way valve) 110 of the base block assembly BA, and a joint block 160 to which a connecting pipe 161 is connected is provided on the downstream side of the switch valve (two-way valve) 140 of the base block assembly BA.

The fluid control assembly A2 has the exact same configuration as the fluid control assembly A1.

The fluid control assembly A3 is provided with a joint block 135 to which a communicating pipe 136 is connected in place of the mass flow controller 130, on the base block assembly BA.

Note that the "fluid devices" of the present invention include various devices, such as fluid control devices used for controlling a flow of a fluid of a gas or liquid, and pressure gauges and joint blocks, that do not control the fluid, but are provided to the flow path, and the "fluid devices" are provided with a body defining a fluid flow path, and comprise at least two flow path ports that open at a bottom surface of this body. Specifically, the fluid devices include a switch valve (two-way valve), a regulator, a pressure gauge, a switch valve (three-way valve), a mass flow controller, and the like, but are not limited thereto.

To three fluid control assemblies A1 to A3 of the fluid control system 1, a process gas such as ammonia gas is introduced through the introducing pipe 151 of the fluid control assembly A1, a process gas such as hydrogen gas is introduced through the introducing pipe 151 of the fluid control assembly A2, and a purge gas such as nitrogen gas is introduced through the introducing pipe 151 of the fluid control assembly A3, for example.

Three switch valves (three-way valves) 120 are connected to one another by a communicating pipe 300, and thus the purge gas can be introduced to the flow path of the process gas.

The joint block 135 described above to which the communicating pipe 136 is connected is provided midway on the flow path in place of the mass flow controller 130 since the mass flow controller 130 is not required in the flow path of the purge gas.

A supply pipe part 400 includes the connecting pipes 161 connected to the three joint blocks 160 and a discharge pipe 162 connecting these connecting pipes 161, and is connected to a processing chamber (not illustrated) to supply the processed gas.

As understood from FIG. 1A to FIG. 2B, the base block assembly BA includes a fixing block 30, base blocks 10A, 10B, 10C, a coupling base block 20, a base block 10D, a base block 10E, and the fixing block 30 arranged from the upstream side toward the downstream side, and these are coupled to each other by tightening bolts 50. The dimensions of the base block assembly BA are about 10 mm in width and 20 mm in height, and a total length thereof is about 300 mm.

The dimensions, however, are not limited thereto. Further, the tightening bolts 50 used are M5 bolts with heads, but are not limited thereto.

The base blocks 10A to 10E support various fluid devices 110 to 140 described above, and each plays the role of providing a flow path that communicates the flow paths formed in the bodies of two adjacent fluid devices of the various fluid devices 110 to 140. In addition, of the base blocks 10A to 10E, the adjacent base blocks support the various fluid devices in cooperation. That is, each fluid device is supported by two adjacent base blocks.

The basic structures of the base blocks 10A to 10E are similar. Specifically, the structures are generally classified into the base blocks 10A, 10E having three screw holes formed from the upper surface toward the bottom surface, and the base blocks 10B, 10C, 10D having two screw holes formed from the upper surface toward the bottom surface. The base block 10A is disposed on an end portion in the longitudinal direction (upstream side) G1, and the base block 10E is disposed on an end portion in the longitudinal direction (downstream side) G2. The base blocks 10B, 10C, 10D are disposed between the base blocks 10A, 10E. In this specification, the detailed structures of the base block 10A and the base block 10C representing the two types are described with reference to FIG. 3A to FIG. 4E, and the structures of the other base blocks are illustrated in FIG. 2A and the like.

Figure 3A:
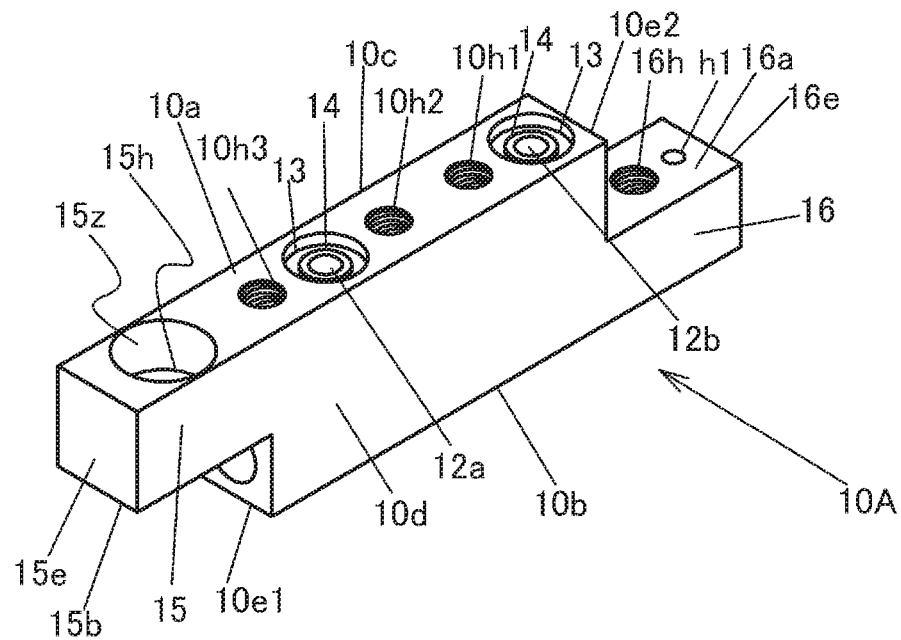
FIG. 3A is an external perspective view of a base block 10A.
Figure 3B:
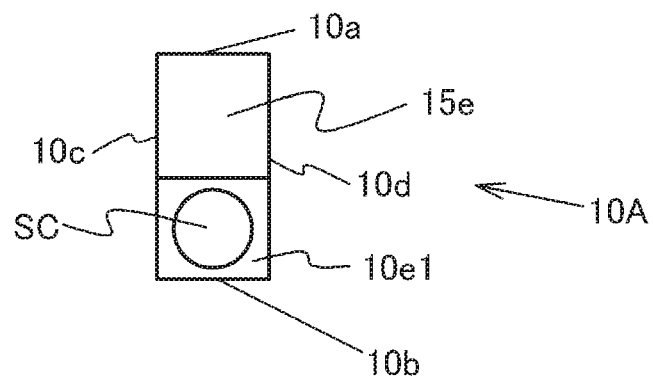
FIG. 3B is a left side view of the base block 10A.
Figure 3C:
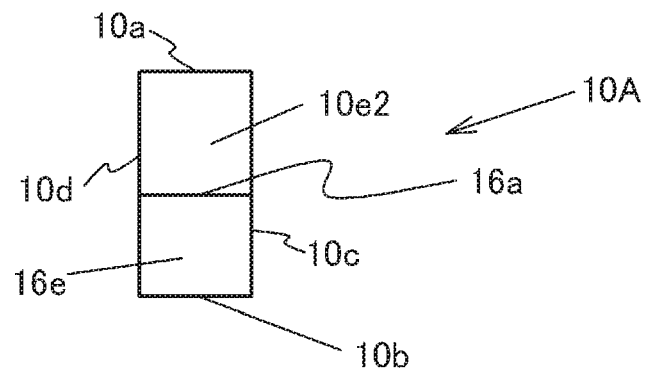
FIG. 3C is a right side view of the base block 10A.
Figure 3D:
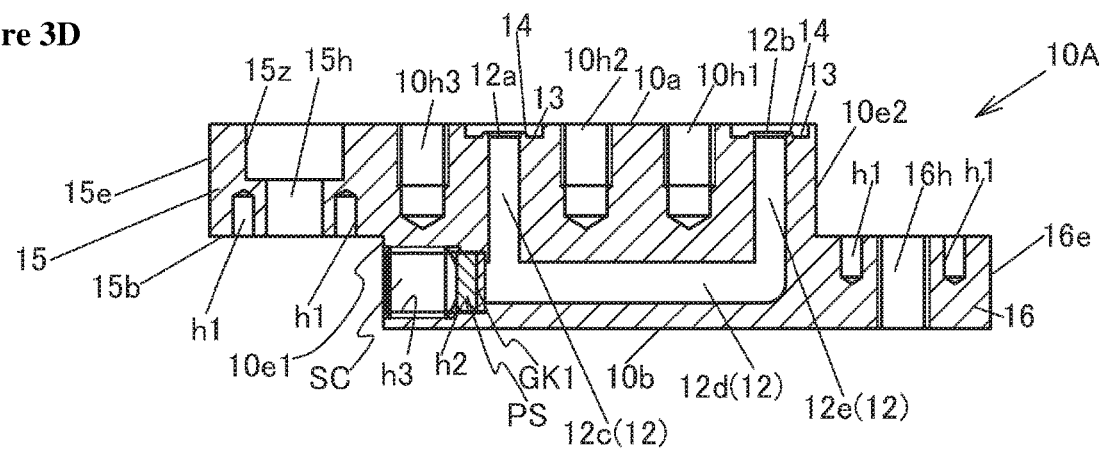
FIG. 3D is a cross-sectional view of the base block 10A in a longitudinal direction.
Figure 3E:
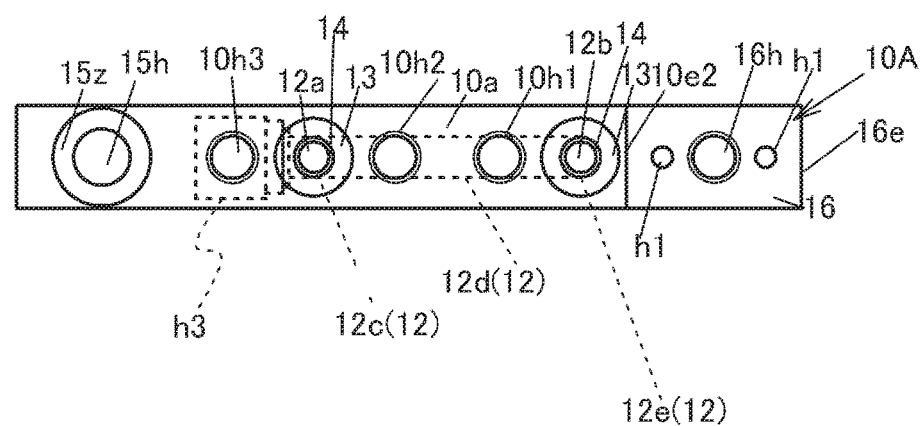
FIG. 3E is a top view of the base block 10A as viewed from the upper surface side.

FIG. 3A to FIG. 3E show the structure of the base block 10A, FIG. 3A being an external perspective view, FIG. 3B being a left side view, FIG. 3C being a right side view, FIG. 3D being a cross-sectional view cut in the longitudinal direction, and FIG. 3E being a top view.

The base block 10A is a member made of a metal such as a stainless alloy, and comprises an upper surface 10a and a bottom surface 10b, which are flat surfaces opposite to each other, two side surfaces 10c, 10d, each orthogonal to the upper surface 10a and the bottom surface 10b, an end surface 10e1 on one side in the longitudinal direction and orthogonal to the bottom surface 10b, and an end surface 10e2 on the other side in the longitudinal direction and orthogonal to the upper surface 10a. Further, a coupling part 15 is formed protruding from the end surface 10e1 in the longitudinal direction, and a coupling part 16 is formed protruding from the end surface 10e2 in the longitudinal direction. It should be noted that, while an example is given in which the basic shape of the base block 10A is a rectangular parallelepiped shape, another shape can also be adopted.

The coupling part 15 defines portions of the upper surface 10a and both side surfaces 10c, 10d of the base block 10A and, from middle positions of the upper surface 10a and the bottom surface 10b at the end surface 10e1 of the base block 10A, defines a lower surface 15b constituting a flat surface extending parallel with the upper surface 10a and the bottom surface 10b, and an end surface 15e orthogonal to the upper surface 10a, both side surfaces 10c, 10d, and the lower surface 15b. A through hole 15h extending vertically to the upper surface 10a and the lower surface 15b is formed in the coupling part 15, and a counterbore 15z is formed on the upper surface 10a side of the through hole 15h. The counterbore 15z is formed to embed the head of the tightening bolt 50 below the upper surface 10a when the coupling part 15 is coupled to another member using the tightening bolt 50. Two positioning pin holes h1 that open at the lower surface 15b of the coupling part 15 and extend vertically to the lower surface 15b are formed on the upstream side and the downstream side relative to the through hole 15h.

The coupling part 16 defines portions of the bottom surface 10b and both side surfaces 10c, 10d of the base block 10A and, from middle positions of the upper surface 10a and the bottom surface 10b at the end surface 10e2 of the base block 10A, defines an upper surface 16a constituting a flat surface extending parallel with the upper surface 10a and the bottom surface 10b, and an end surface 16e orthogonal to the upper surface 10a, both side surfaces 10c, 10d, and the lower surface 10b. A screw hole 16h that extends vertically from the upper surface 16a and opens at the bottom surface 10b is formed in the coupling part 16. The two positioning pin holes h1 that open at the upper surface 16a of the coupling part 16 and extend vertically to the lower surface 10b are formed on the upstream side and the downstream side relative to the screw hole 16h.

A flow path 12 is formed in the interior of the base block 10A, and comprises a flow path port 12a that opens at a position close to the coupling part 15 side of the upper surface 10a on one end, and a flow path port 12b that opens at a position close to the coupling part 16 side of the upper surface 10a on the other end. Around each of the flow path ports 12a, 12b, a holding part 13 for holding a gasket GK described later is formed, and on a bottom surface of this holding part 13, a protruding part 14 having a circular shape is formed concentrically with each of the flow path ports 12a, 12b. The protruding part 14 is subjected to a hardening treatment that increases the hardness sufficiently to a value greater than that of a formation material of the gasket GK to cause partial deformation of the gasket GK.

The flow path 12 includes first flow paths 12c, 12e respectively extending from the flow path ports 12a, 12b toward the bottom surface 10b side, and a second flow path 12d extending through the interior of the base block 10A in a longitudinal direction and connected to each of the two first flow paths 12c, 12e. As understood from FIG. 3D, the position of the second flow path 12d is biased to the bottom surface 10b side between the upper surface 10a and the bottom surface 10b. This is to secure a screw hole depth of screw holes 10h1, 10h2 described later, but is not limited to this position.

The screw holes 10h1, 10h2 are positioned apart from each other in the longitudinal direction, they are formed between the two flow path ports 12a, 12b, open at the upper surface 10a, extend toward the bottom surface 10b side, and are closed above the second flow path 12d.

As understood from FIG. 3E, the screw holes 10h1, 10h2 are formed overlapping with the second flow path 12d in a top view of the base block as viewed from the upper surface 10a side. With adoption of such an arrangement, the base block 10A can be formed at an extremely narrow width of 10 mm, for example.

A screw hole 10h3 is formed between the through hole 15h and the flow path port 12a in the longitudinal direction, opens at the upper surface 10a, and extends toward the bottom surface 10b side.

The screw hole 10h1 is provided for coupling to a body 111 of the switch valve (two-way valve) 110, and the screw holes 10h2, 10h3 are provided for fixing the joint block 150.

An end portion of the second flow path 12d on the first flow path 12c side communicates with a holding part h2 having a diameter larger than that of the second flow path 12d, and the holding part h2 communicates with a screw hole h3 that opens at the end surface 10e1. In a connecting part of the holding part h2 with the second flow path 12d, a gasket GK1 having a disc shape and made of a metal or a resin is provided, and on the back of this gasket GK1, a pressing member PS for preventing rotation of the gasket is provided. A male screw member SC is screwed into the screw hole h3, and a hemispherical tip end surface of the male screw member SC presses the pressing member PS toward the gasket GK1, thereby closing the end portion of the second flow path 12d.

Figure 4A:
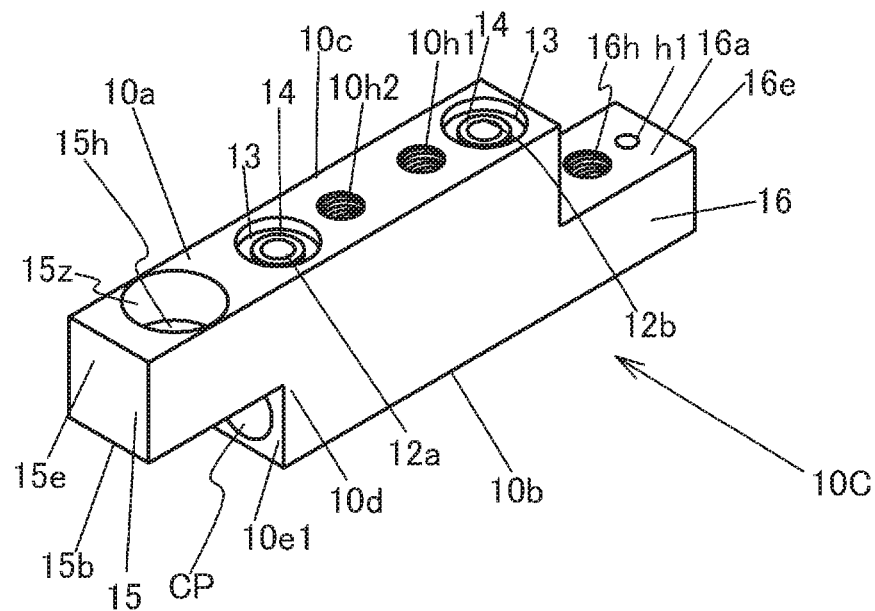
FIG. 4A is an external perspective view of a base block 10C.
Figure 4B:
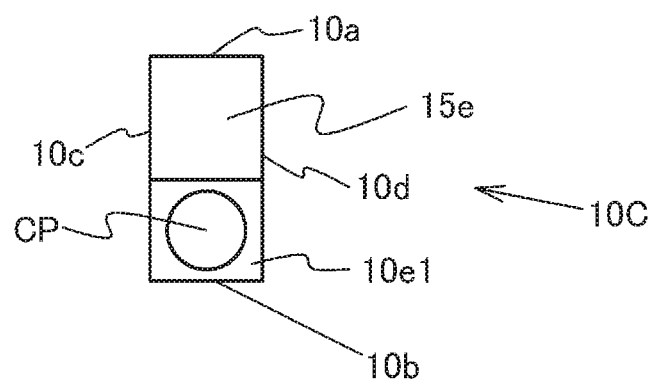
FIG. 4B is a left side view of the base block 10C.
Figure 4C:
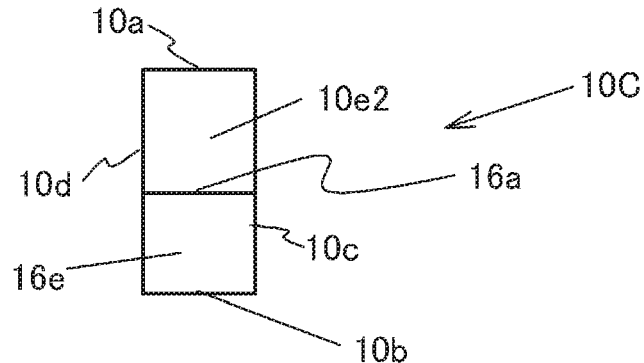
FIG. 4C is a right side view of the base block 10C.
Figure 4D:
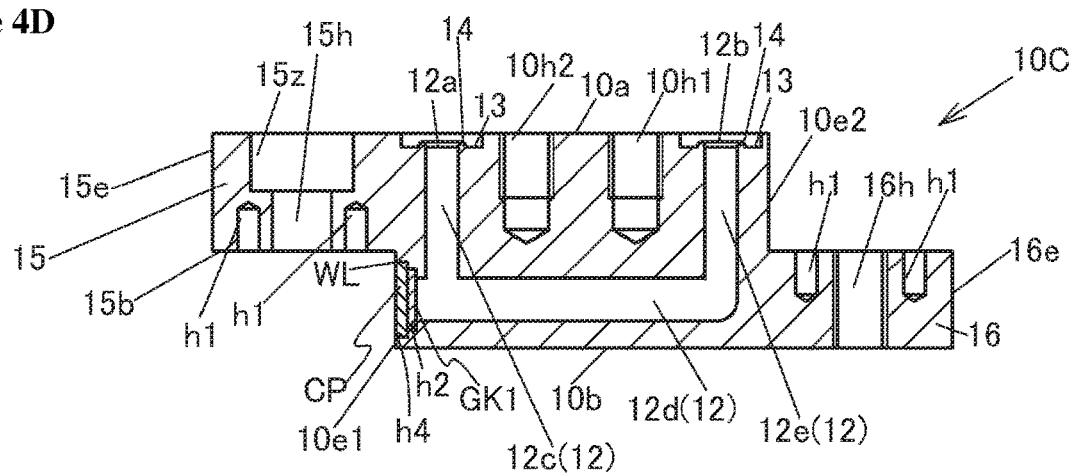
FIG. 4D is a cross-sectional view of the base block 10C in the longitudinal direction.
Figure 4E:
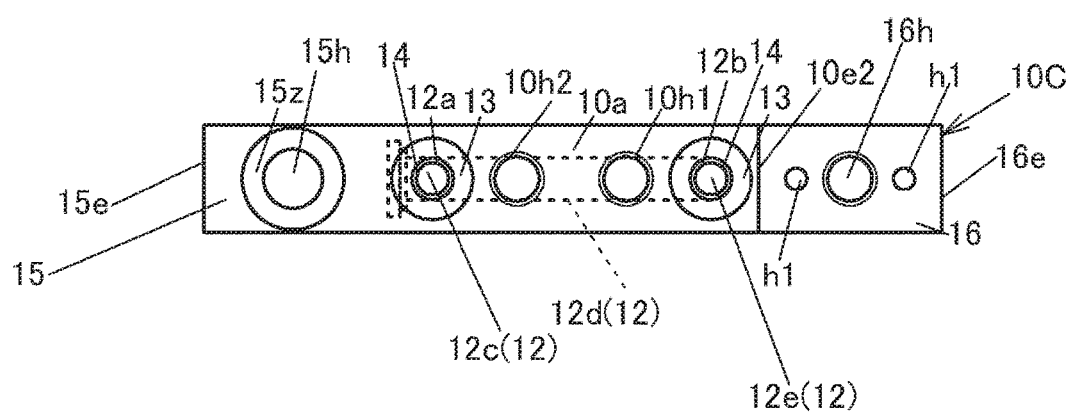
FIG. 4E is a top view of the base block 10C as viewed from the upper surface side.

FIG. 4A to FIG. 4E show the structure of the base block 10C, FIG. 4A being an external perspective view, FIG. 4B being a left side view, FIG. 4C being a right side view, FIG. 4D being a cross-sectional view cut in the longitudinal direction, and FIG. 4E being a top view. In FIG. 4A to FIG. 4E, the same reference numerals as used in FIG. 3A to FIG. 3E indicate the same or similar function, duplicate descriptions are omitted, and only different components are described here.

In the base block 10C, no screw hole 10h3 is formed between the through hole 15h and the flow path port 12a in the longitudinal direction.

The end portion of the second flow path 12d of the base block 10c on the first flow path 12c side communicates with the holding part h2 and a closing plate holding part h4 having a diameter larger than that of the holding part h2, and the gasket GK1 held by the holding part h2 seals the end portion of the flow path 12d by being pressed against the flow path 12d side by a closing plate CP made of metal. A welding material is adhered between the closing plate CP and the closing plate holding part h4 on the end surface 10e1 side, thereby sealing the closing plate CP and the closing plate holding part h4 together, and fixing the closing plate CP to the closing plate holding part h4.

Here, a machining method of the flow path 12 of the base blocks 10A, 10C described above will be explained.

The first flow paths 12c, 12e may be formed by drilling a bind hole vertical into the upper surface 10a of the base blocks 10A, 10C, for example. The second flow path 12d may be formed by drilling a blind hole vertically into the end surface 10e1 of the base blocks 10A, 10C. At this time, the second flow path 12d is machined at a height connected to the tip end portions of the first flow paths 12c, 12e. With such a machining method adopted, the flow path 12 can be relatively easily formed in the base blocks 10A, 10C having narrowed widths. While it is also possible to form a so-called V-shaped flow path inclined relative to the upper surface 10a, such machining is difficult and makes it difficult to sufficiently secure the forming regions of the screw holes 10h1, 10h2.

As illustrated in FIGS. 2A and 2B, the base blocks 10A, 10B, the base blocks 10B, 10C, the base blocks 10C, 10D, and the base blocks 10D, 10E are coupled to each other by the coupling parts 15, 16 using the tightening bolts 50. These pairs of base blocks have an upstream-side base block and a downstream-side base block relationship in the present invention.

The base blocks 10C, 10D are coupled to each other by the coupling base block 20.

The coupling base block 20 is a member made of a metal such as a stainless alloy, and as illustrated in FIG. 2A, it has a left-right symmetrical shape, and comprises an upper surface 20a and a bottom surface 20b, which are flat surfaces opposite to each other, two side surfaces 20c, 20d, each orthogonal to the upper surface 20a and the bottom surface 20b, and end surfaces 20e, 20e in the longitudinal direction, orthogonal to the bottom surface 20b.

Further, a coupling part 21 is formed protruding from each of the end surfaces 20e in the longitudinal direction. It should be noted that, while an example is given in which the basic shape of the coupling base block 20 is a rectangular parallelepiped shape, another shape can also be adopted.

The coupling part 21 defines portions of the upper surface 20a and both side surfaces 20c, 20d of the coupling base block 20, and defines a lower surface 21b constituting a flat surface extending parallel with the upper surface 20a and the bottom surface 20b from a middle position of the end surface 20e between the upper surface 20a and the bottom surface 20b of the coupling base block 20, and further defines an end surface 21e orthogonal to the upper surface 20a, both side surfaces 20c, 20d, and the lower surface 21b.

A through hole 21h extending vertically to the upper surface 20a and the lower surface 21b is formed in the coupling part 21, and a counterbore 21z is formed on the upper surface 20a side of the through hole 21h. The counterbore 21z is formed to embed the head of the tightening bolt 50 below the upper surface 20a when the coupling part 21 is coupled with another member using the tightening bolt 50. Although not illustrated, in the coupling part 21, positioning pin holes are formed on the upstream side and the downstream side relative to the through hole 21h, similar to the coupling part of the base block 10A.

The fixing block 30 is a member made of a metal such as a stainless alloy and, as illustrated in FIG. 2A, defines a rectangular parallelepiped shape, an upper surface 30a, a bottom surface 30b, both side surfaces 30c, 30d, and both end surfaces 30e1, 30e2 in the longitudinal direction.

A through hole 31 is formed on one side of the upper surface 30a in the longitudinal direction, orthogonally to the bottom surface 30b. A tightening bolt 60 is inserted through this through hole 31 and is screwed into a screw hole 503 formed into the installation surface 502 of the base plate 500, thereby fixing the fixing block 30 to the installation surface 502. While, for example, an M4 bolt is used as the tightening bolt 60, the size is not limited thereto. Since the extremely large tightening force required for coupling base blocks is not necessary, a bolt having relatively small dimensions can be used.

A screw hole 32 is formed on the other side of the upper surface 30a in the longitudinal direction, and the tightening bolt 50 for coupling to the base block 10A or 10E is screwed into this screw hole 32.

As illustrated in FIG. 2A, when the fixing block 30, the base blocks 10A, 10B, 10C, the coupling base block 20, the base block 10D, the base block 10E, and the fixing block 30 are each coupled via positioning pins DP by the tightening force of the tightening bolts 50, the long base block assembly BA is formed in the longitudinal directions G1, G2, as illustrated in FIG. 2B. The base block assembly BA has a form in which the upper surface, the bottom surface, and both side surfaces are substantially flush, and appears as a single long base block. The plurality of blocks are thus coupled using the tightening force of the tightening bolts 50, making the support rigidity for supporting the various fluid devices of the base block assembly BA extremely high compared to when single base blocks are individually fixed on the base plate. In particular, for each of the coupling parts 15, 16, 21, the upper and lower surfaces 15b, 16a, 21b are pressed into contact with each other by the strong tightening force of the tightening bolts 50, thus integrating the base blocks.

Figure 5A:
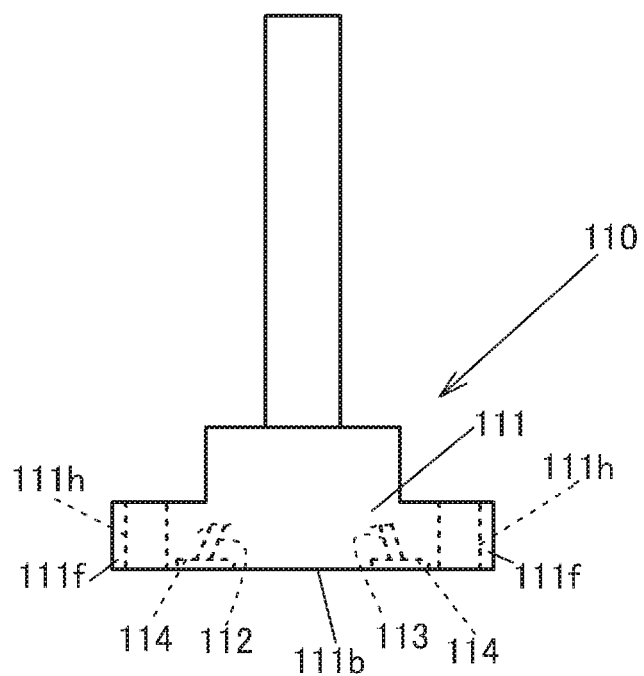
FIG. 5A is a front view of a switch valve 110.
Figure 5B:
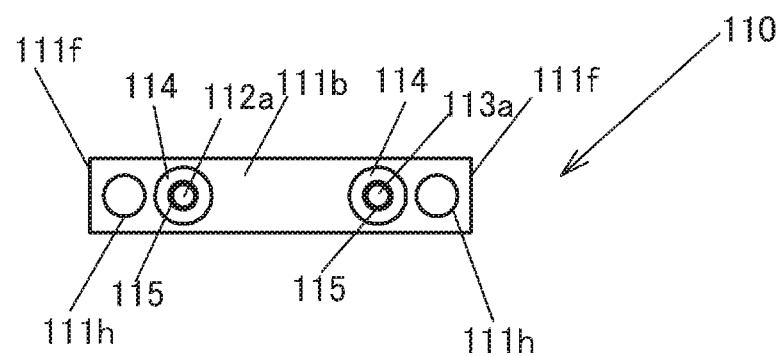
FIG. 5B is a bottom view of the switch valve in FIG. 5A.

FIG. 5A and FIG. 5B are drawings illustrating the switch valve (two-way valve) 110 as a fluid device, FIG. 5A being a front view and FIG. 5B being a bottom view.

The switch valve (two-way valve) 110 comprises the body 111, and a width of this body 111 matches the width of the base block assembly BA (refer to FIG. 1A to FIG. 1C), and is, for example, about 10 mm. However, the width is not limited thereto.

The body 111 defines flow paths 112, 113. These flow paths 112, 113 communicate in the interior of the switch valve (two-way valve) 110, and are opened and closed by a built-in control valve (not illustrated).

A flange part 111f is formed in each of both end portions of the body 111 in the longitudinal direction, and a through hole 111h for the tightening bolt 50 is formed in each of the flange parts 111f.

The flow paths 112, 113 respectively comprise flow path ports 112a, 113a opening at a bottom surface 111b, and holding parts 114 for respectively holding the gaskets GK are formed around the flow path ports 112a, 113a. A protruding part 115 similar to the circular protruding part 14 formed in the base block 10A is formed on the bottom surface of the holding part 114.

Note that, while the body 111 of the switch valve (two-way valve) 110 is illustrated, a body 121 of the switch valve (three-way valve) 120, a body 131 of the mass flow controller 130, and a body 141 of the switch valve (two-way valve) 140, which are other fluid devices, also match the base block assembly BA in width. Then, these bodies 121, 131, 141 each comprise two flow path ports on the bottom surface, and a flange in which a through hole for the tightening bolt 50 is formed, as well as a holding part for holding the gasket GK and a projection having a circular shape. A detailed description of these fluid devices is omitted.

As illustrated in FIG. 2B, the gasket GK is disposed around each of the abutting flow path ports, between the upper surface of the base block assembly BA and the bottom surface of each of the bodies 111 to 141, and is pressed by the tightening force of the tightening bolt 50. Examples of this gasket GK include, a gasket made of a metal, a resin, or the like.

Examples of the gasket include a soft gasket, a semi-metal gasket, a metal gasket, and the like. Specifically, the gaskets below are preferably used.

(1) Soft gasket
  Rubber O-ring
  Rubber sheet (for a flat face)
  Joint sheet
  Expanded graphite sheet
  Polytetrafluoroethylene (PTFE) sheet
  Polytetrafluoroethylene (PTFE) jacket type
(2) Semi-metal gasket
  Spiral-wound gasket
  Metal jacket gasket
(3) Metal gasket
  Metal flat gasket
  Metal hollow O-ring
  Ring joint The fluid control assemblies A1 to A3 can be formed by, for example, forming the base block assembly BA and then fixing the bodies 111 to 141 of the fluid devices to the base block assembly BA using the tightening bolts 50, as illustrated in FIG. 2B. The bottom surface of each of the bodies 111 to 141 is wholly supported by the upper surface of the base block assembly BA, and thus the various fluid devices 110 to 146 are supported in a more stable manner.

Figure 6A:
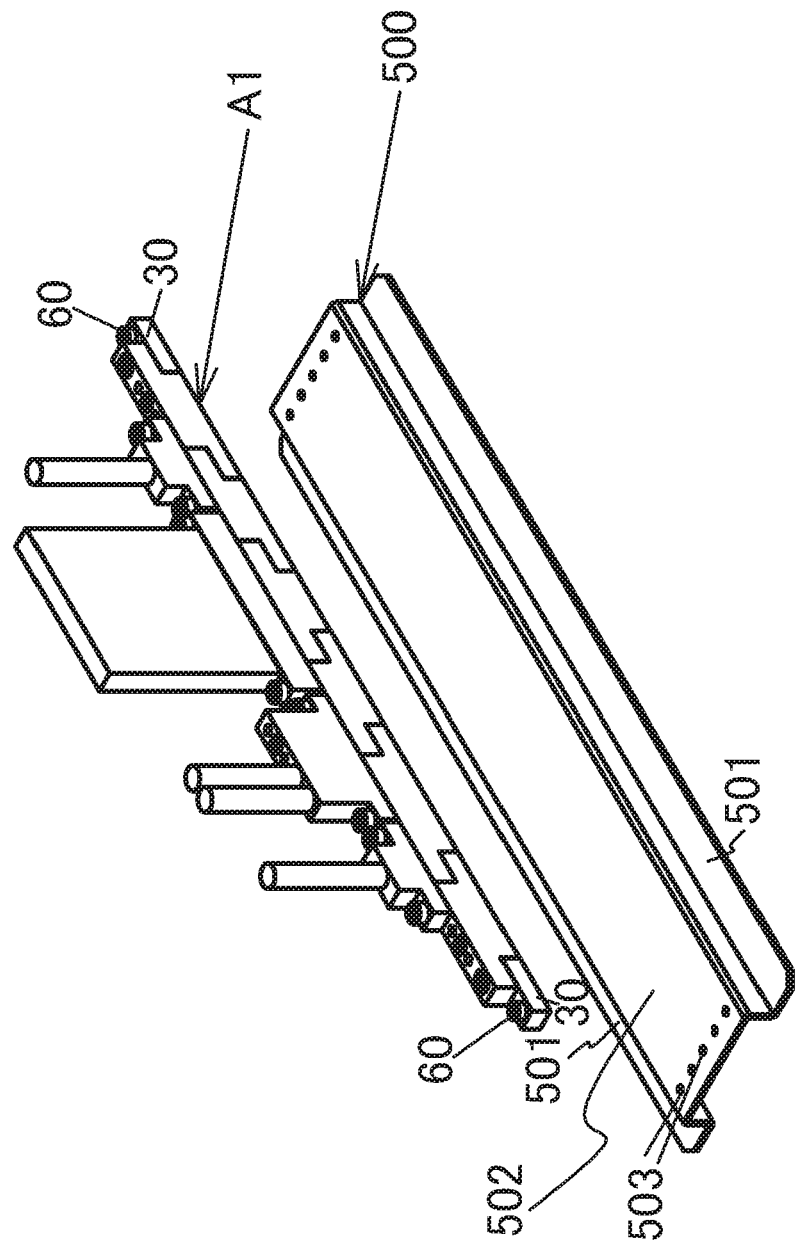
FIG. 6A is a drawing showing an assembly procedure of the fluid control system in FIG. 1A.

The fluid control assembly A1 thus formed is fixed by screwing the tightening bolt 60 into the screw hole 503 in a desired position of the installation surface 502 of the base plate 500, as illustrated in FIG. 6A.

Figure 6B:
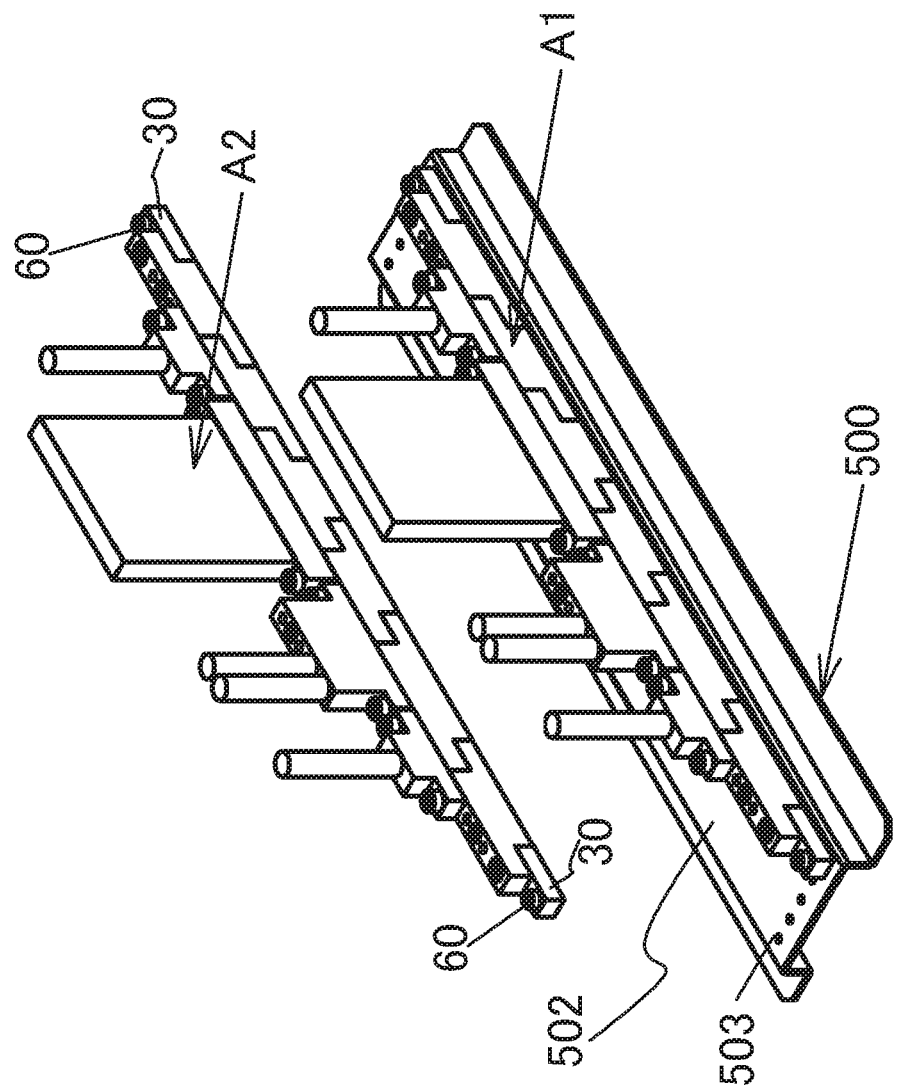
FIG. 6B is a drawing showing the assembly procedure, continuing from FIG. 6A.

Next, the fluid control assembly A2 is arranged in parallel with the fluid control assembly A1 and fixed by screwing the tightening bolt 60 into the screw hole 503 in a desired position of the installation surface 502, as illustrated in FIG. 6B.

Figure 6C:
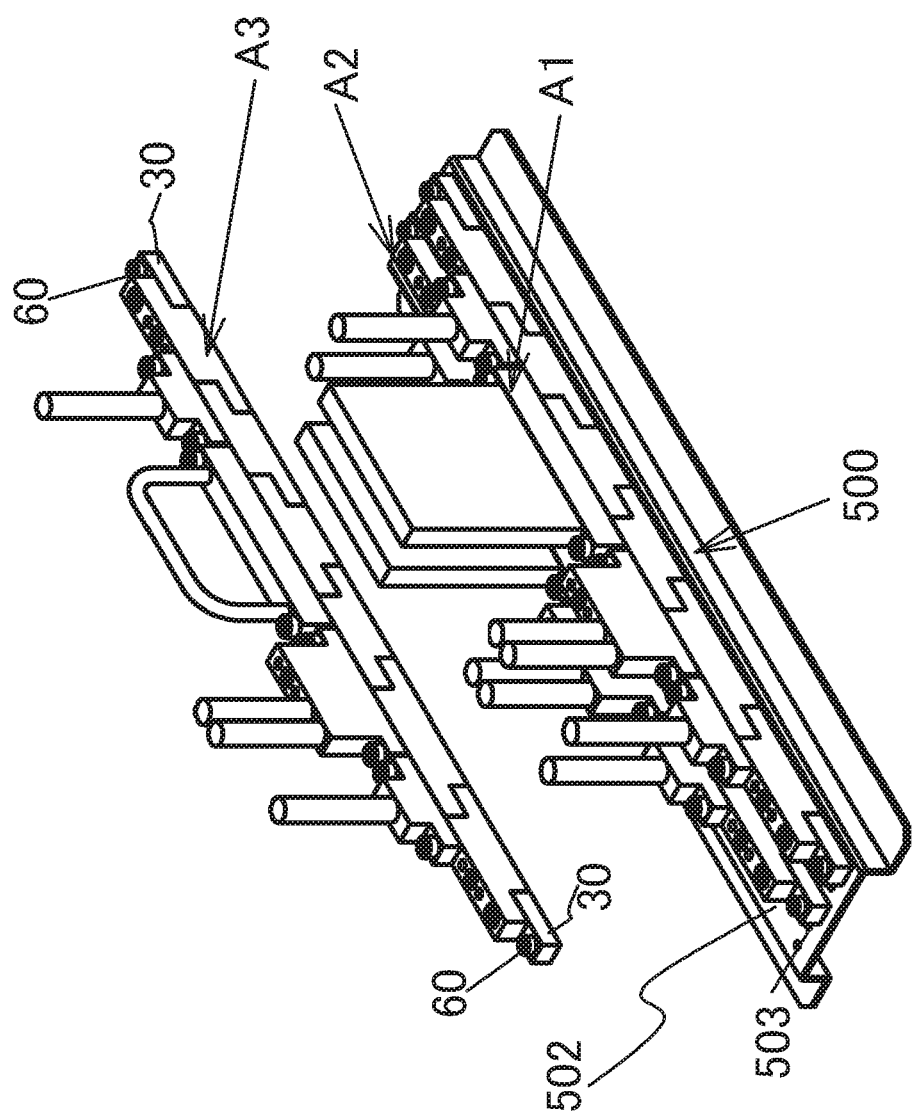
FIG. 6C is a drawing showing the assembly procedure, continuing from FIG. 6B.

Next, the fluid control assembly A3 is arranged in parallel with the fluid control assembly A2 and fixed by screwing the tightening bolt 60 into the screw hole 503 in a desired position of the installation surface 502, as illustrated in FIG. 6C.

Figure 6D:
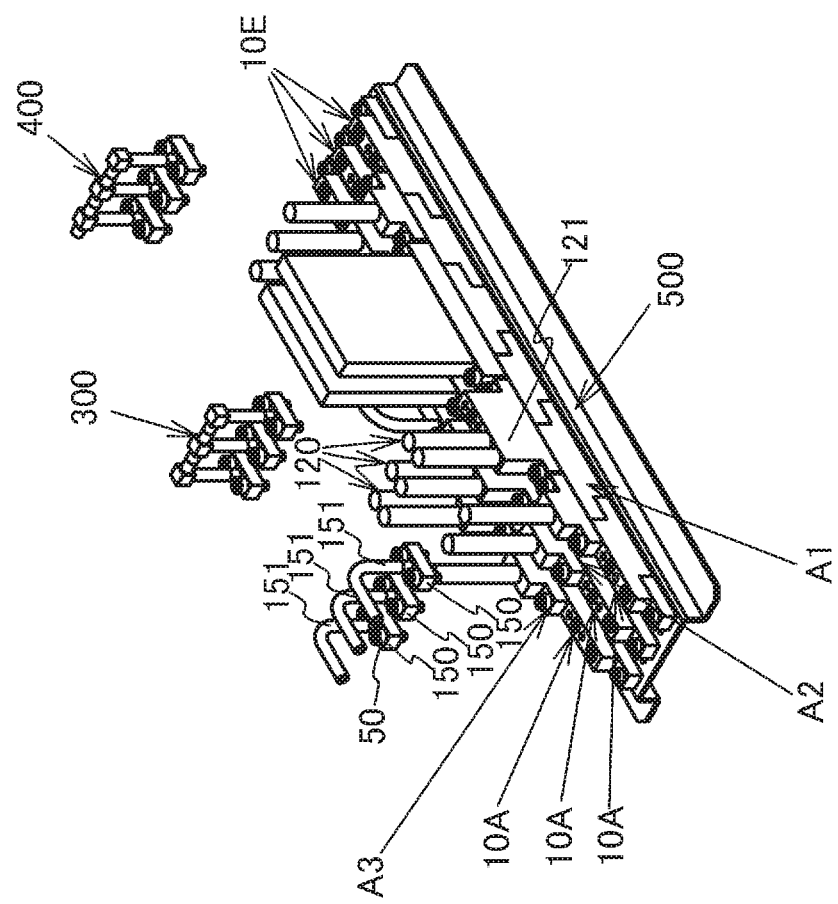
FIG. 6D is a drawing showing the assembly procedure, continuing from FIG. 6C.

Lastly, the joint block 150 is installed in each of the base blocks 10A of the fluid control assemblies A1 to A3, the communicating pipe 300 is installed to the three switch valves (three-way valve) 120, and the supply pipe part 400 is installed in each of the base blocks 10E of the fluid control assemblies A1 to A3, as illustrated in FIG. 6D. As a result, the fluid control system 1 is formed.

Note that, in the embodiment described above, while a case where the three fluid control assemblies A1 to A3 are disposed apart from each other on the installation surface 502 of the base plate 500 is illustrated, a maximum of five fluid control assemblies can be installed on the base plate 500 of this embodiment. That is, a fluid control assembly can be installed between the fluid control assembly A1 and the fluid control assembly A2, and between the fluid control assembly A2 and the fluid control assembly A3.

Figure 7A:
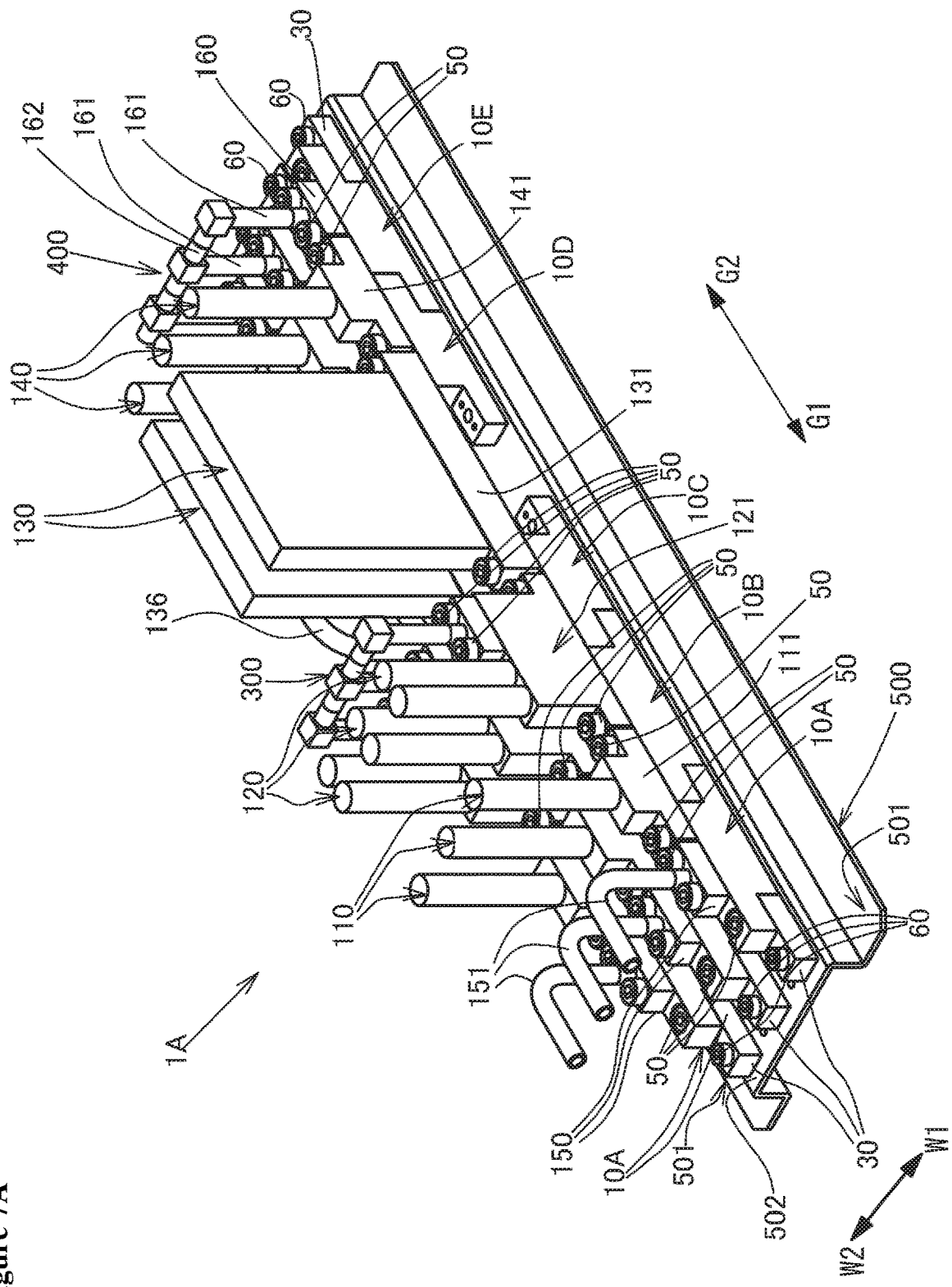
FIG. 7A is an external perspective view of the fluid control system according to a second embodiment of the present invention.
Figure 7B:
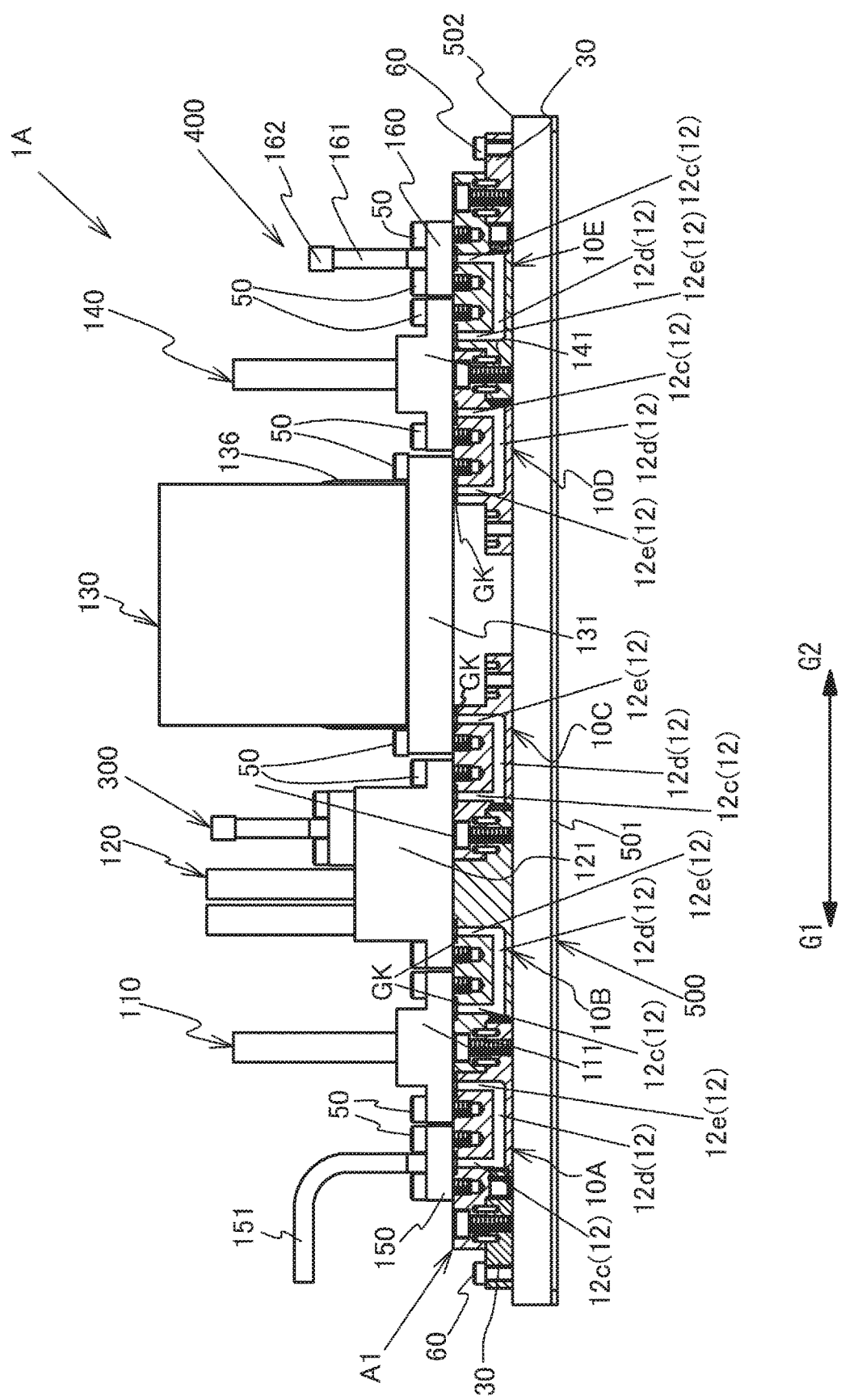
FIG. 7B is a front view including a partial cross section of only the base block of the fluid control system in FIG. 7A.

FIG. 7A and FIG. 7B are drawings illustrating a fluid control system 1A according to a second embodiment of the present invention, FIG. 7A being an external perspective view, and FIG. 7B being a front view including a partial cross section of only the base block of the fluid control system 1A in FIG. 7A.

The difference between this embodiment and the first embodiment described above is that, in this embodiment, the coupling base block 20 is not used. Accordingly, a single base block assembly BA is not formed. The fixing block 30, the base block 10A, the base block 10B, and the base block 10C are coupled to each other, and the base block 10D, the base block 10E, and the fixing block 30 are coupled to each other.

Even without the coupling base block 20 coupling the base block 10C and the base block 10D, both end portions of the body 131 of the mass flow controller 130 in the longitudinal direction are supported by and fixed to the upper surfaces 10a of the base block 10C and the base block 10D. Thus, such a configuration can also be adopted.

While, in each of the embodiments described above, the coupling parts 15, 16 are formed in both end portions of the base block, a configuration in which the coupling part is formed only in one end portion of the base block, for example, can also be adopted. That is, a configuration in which only two base blocks are coupled can also be adopted.

While, in the embodiment described above, a case where two flow path ports are defined in the body of the fluid device is illustrated, the present invention is not limited thereto, and for example, a fluid device including a body in which three flow path ports (not illustrated) are formed on the bottom surface is also be subject to the present invention.

DESCRIPTIONS OF REFERENCE NUMERALS 1, 1A Fluid control system
10A, 10B, 10C, 10D, 10E Base block
10a Upper surface
10b Bottom surface
10c, 10d Side surface
10e1, 10e2 End surface
10h1, 10h2, 10h3 Screw hole
12 Flow path 12a, 12b Flow path port
12c, 12e First flow path
12d Second flow path
13 Holding part
14 Protruding part
15 Coupling part
15b Lower surface
15e End surface
15h Through hole
15z Counterbore
16 Coupling part
16a Upper surface
16e End surface
16h Screw hole
20 Coupling base block
20a Upper surface
20b Bottom surface
20c, 20d Side surface
20e End surface
21 Coupling part
21b Lower surface
21e End surface
21h Through hole
21z Counterbore
30 Fixing block
30a Upper surface
30b Bottom surface
30c, 30d Side surface
30e1, 30e2 End surface
31 Through hole
32 Screw hole
50, 60 Tightening bolt
110 Switch valve (two-way valve)
111 Body
111b Bottom surface
111f Flange part
111h Through hole
112, 113 Flow path
112a, 113a Flow path port
114 Holding part
115 Protruding part
120 Switch valve (three-way valve)
121 Body
130 Mass flow controller
131 Body
135 Joint block
136 Communicating pipe
140 Switch valve (two-way valve)
141 Body
150 Joint block
151 Introducing pipe
160 Joint block
161 Connecting pipe
162 Discharge pipe
300 Communicating pipe
400 Supply pipe part
500 Base plate
501 Support part
502 Installation surface
503 Screw hole
A1, A2, A3 Fluid control assembly
BA Base block assembly
h1 Positioning pin hole
h2 Holding part
h3 Screw hole
h4 Closing plate holding part
CP Closing plate
PS Pressing member
DP Positioning pin
G1 Longitudinal direction (upstream side)
G2 Longitudinal direction (downstream side)
GK, GK1 Gasket
SC Male screw member
W1 Width direction (front side)
W2 Width direction (rear side)

What is claimed is:

1. A fluid control system comprising:
a fluid device provided with a body defining a body fluid flow path through which fluid can flow in a fluid flow direction from upstream to downstream, the body fluid flow path comprising two body flow path ports that open at a bottom surface of the body;
an upstream-side base block and a downstream-side base block, the downstream-side base block positioned downstream of the upstream-side base block in the fluid flow direction, wherein:
the upstream-side and downstream-side base blocks each:
define an upper surface on which a portion of the body of the fluid device is installed, a bottom surface opposite to the upper surface, and side surfaces extending from the upper surface toward the bottom surface side,
define a fluid flow path comprising two block flow path ports that open on an upstream side and a downstream side of the upper surface, and
comprise a screw hole that is formed between the block two flow path ports, opens at the upper surface, and extends toward the bottom surface side;
the upstream-side and downstream-side base blocks and the body of the fluid device are coupled by tightening forces of tightening bolts passed through the body of the fluid device and screwed into the screw holes of the upstream-side and downstream-side base blocks;
a seal disposed around each of the two body flow path ports of the fluid device respectively abutted against the block flow path port on the downstream side of the upstream-side base block and the block flow path port on the upstream side of the downstream-side base block and pressed between the upstream-side and downstream-side base blocks and the body of the fluid device, wherein
a downstream-side end portion of the upstream-side base block and an upstream-side end portion of the downstream-side base block are coupled by a said tightening bolt.

2. The fluid control system according to claim 1, wherein the block flow path defined by each of the upstream-side and downstream-side base blocks comprises two first block flow paths respectively extending from the two block flow path ports toward the bottom surface side, and a second block flow path extending through interior of each of the upstream-side and downstream-side base blocks and connected to each of the two first block flow paths.

3. The fluid control system according to claim 2, wherein the position of the second block flow path is positioned at the bottom surface side between the upper surface and the bottom surface of the each of upstream-side and downstream-side base blocks.

4. The fluid control system according to claim 2, wherein the screw holes are each formed so as to at least partially overlap with the second block flow path in a top view of the upstream-side and downstream-side base blocks as viewed from the upper surface side, and are closed above the second block flow path.

5. The fluid control system according to claim 2, further comprising:
a closing member, wherein:
the second block flow path includes an opening at one end surface of each of the upstream-side and downstream-side base blocks; and
the closing member closes the opening.

6. The fluid control system according to claim 5, wherein the closing member is fixed by welding to the opening at the one end surface, or is fixed by being pressed by a male screw member screwed into a female screw part formed in an opening leading to the second block flow path.

7. The fluid control system according to claim 1, wherein the screw holes formed between the two first block flow paths comprise a first screw hole for fixing the body of the fluid device to the upper surface of the upstream-side or downstream-side base block, and a second screw hole for fixing the body of another fluid device or a joint block to the upper surface of the upstream-side or the downstream-side base block.

8. The fluid control system according to claim 1, wherein:
each end portion of each of the upstream-side and downstream-side base blocks comprises a coupling part; and
the coupling part comprises a through hole or a screw hole that can be accessed from an upward direction orthogonal to the upper surface, the through hole allowing a tightening bolt to be passed therethrough, and the screw hole allowing a tightening bolt to be screwed therein.

9. The fluid control system according to claim 1, further comprising a fixing block coupled by a tightening bolt to one end portion of a base block assembly formed by a plurality of base blocks including the upstream-side and downstream-side base blocks, the fixing bock being fixable by a tightening bolt to a base plate on which the base block assembly is installed.

10. The fluid control system according to claim 1, further comprising positioning mechanisms for determining relative positions of the downstream-side end portion of the upstream-side base block and the upstream-side end portion of the downstream-side base block, the positioning mechanisms being provided in a coupling part of the downstream-side end portion and the upstream-side end portion and on an upstream side and a downstream side of a tightening bolt used with the coupling part.

11. A method for manufacturing a fluid control system comprising:
forming a base block assembly by coupling end portions of a plurality of base blocks including at least the upstream-side and downstream-side base blocks described in claim 1;
forming one or a plurality of fluid control assemblies by arranging the one or plurality of fluid devices in predetermined positions on an upper surface of the base block assembly and fixing a body of the one or plurality of fluid devices to the upper surface using tightening bolts; and
fixing the one or plurality of fluid control assemblies on a base plate.

12. A product manufacturing method comprising using the fluid control system described in claim 1 for controlling the process gas in a manufacturing process of a product such as a semiconductor device, a flat panel display, or a solar panel that requires a treatment process by a process gas in a sealed chamber.

13. A fluid control system comprising:
a fluid device provided with a body defining a body fluid flow path through which fluid can flow in a fluid flow direction from upstream to downstream, the body fluid flow path comprising two body flow path ports that open at a bottom surface of the body;
an upstream-side base block and a downstream-side base block, the downstream-side base block positioned downstream of the upstream-side base block in the fluid flow direction; and
a coupling base block, wherein:
the upstream-side and downstream-side base blocks each:
define an upper surface on which a portion of the body of the fluid device is installed, a bottom surface opposite to the upper surface, and side surfaces extending from the upper surface toward the bottom surface side,
define a fluid flow path comprising two block flow path ports that open on an upstream side and a downstream side of the upper surface, and
comprise a screw hole that is formed between the two block flow path ports, opens at the upper surface, and extends toward the bottom surface side;
the upstream-side and downstream-side base blocks and the body of the fluid device are coupled by tightening forces of tightening bolts passed through the body of the fluid device and screwed into the screw holes of the upstream-side and downstream-side base blocks;
a seal disposed around each of the two body flow path ports of the fluid device respectively abutted against the block flow path port on the downstream side of the upstream-side base block and the block flow path port on the upstream side of the downstream-side base block and pressed between the upstream-side and downstream-side base blocks and the body of the fluid device, wherein
the upstream-side base block and the downstream-side base block are disposed apart from each other; and
the coupling base block is coupled to a downstream-side end portion of the upstream-side base block and an upstream-side end portion of the downstream-side base block by tightening bolts, such that the upstream-side base block and the downstream-side base block are coupled together.

* * * * *